US012720235B2

(12) United States Patent
Seo et al.

(10) Patent No.: US 12,720,235 B2
(45) Date of Patent: Aug. 25, 2026

(54) ANALOG FRONT END (AFE) DEVICE FOR LIGHT-RECEIVING SENSOR AND METHOD OF CONTROLLING THE SAME

(71) Applicant: SOLIDVUE, INC., Seongnam-si (KR)

(72) Inventors: Hyeong Seok Seo, Gyeonggi-do (KR); Jun Hee Cho, Gyeonggi-do (KR)

(73) Assignee: SOLIDVUE, INC., Gyeonggi-do (KR)

( * ) Notice: Subject to any disclaimer, the term of this patent is extended or adjusted under 35 U.S.C. 154(b) by 127 days.

(21) Appl. No.: 18/507,335

(22) Filed: Nov. 13, 2023

(65) Prior Publication Data

US 2024/0276123 A1 Aug. 15, 2024

(30) Foreign Application Priority Data

Feb. 13, 2023 (KR) ........................ 10-2023-0018868

(51) Int. Cl.
*H04N 25/773* (2023.01)
*H10F 39/00* (2025.01)

(52) U.S. Cl.
CPC ....... *H04N 25/773* (2023.01); *H10F 39/8037* (2025.01); *H10F 39/813* (2025.01)

(58) Field of Classification Search
CPC . H04N 25/773; H10F 39/8037; H10F 39/813; H10F 77/959; H10F 30/225; G01S 7/4861; G01S 7/4865
See application file for complete search history.

(56) References Cited

U.S. PATENT DOCUMENTS 7,378,693 B2 5/2008 Park
10,801,886 B2 10/2020 Mandai et al.
2010/0019295 A1* 1/2010 Henderson ............ H10F 30/225 257/E27.122
2013/0193546 A1* 8/2013 Webster .................. H10F 71/00 257/438
2018/0195900 A1* 7/2018 Delic ...................... H10F 39/10
2019/0189827 A1* 6/2019 Haraguchi ........... H04N 25/683
2020/0252564 A1* 8/2020 Palubiak ............... H10F 77/959
2022/0102404 A1* 3/2022 Lee ........................ H10F 39/802
2023/0396898 A1* 12/2023 Tsukuda .................. G01S 7/486
2024/0213281 A1* 6/2024 Shimada ............. H10F 39/8063
2024/0397234 A1* 11/2024 Takatsuka ............ H04N 25/773

FOREIGN PATENT DOCUMENTS

JP 2020505602 A 2/2020
KR 1020050090829 A 9/2005
KR 20220041761 A 4/2022

OTHER PUBLICATIONS

Office Action issued in corresponding KR Application No. 10-2023-0018868, issued May 27, 2024, 5 pages.

* cited by examiner

*Primary Examiner* — Thanh Luu
*Assistant Examiner* — Mai Thi Ngoc Tran
(74) *Attorney, Agent, or Firm* — Burris Law, PLLC

(57) ABSTRACT

Provided are an analog front end (AFE) device for a light-receiving sensor and a method of controlling the AFE device. The AFE device includes a plurality of first signal processors implemented with a n-channel metal oxide semiconductor (NMOS) and a p-channel metal oxide semiconductor (PMOS) on a substrate and configured to output detection signals of photo-detecting devices, and a plurality of second signal processors arranged in a position where the plurality of second signal processors are spaced apart from the plurality of first signal processor, on the substrate and configured to control a dead time of the light-receiving devices.

11 Claims, 17 Drawing Sheets

FIG. 10

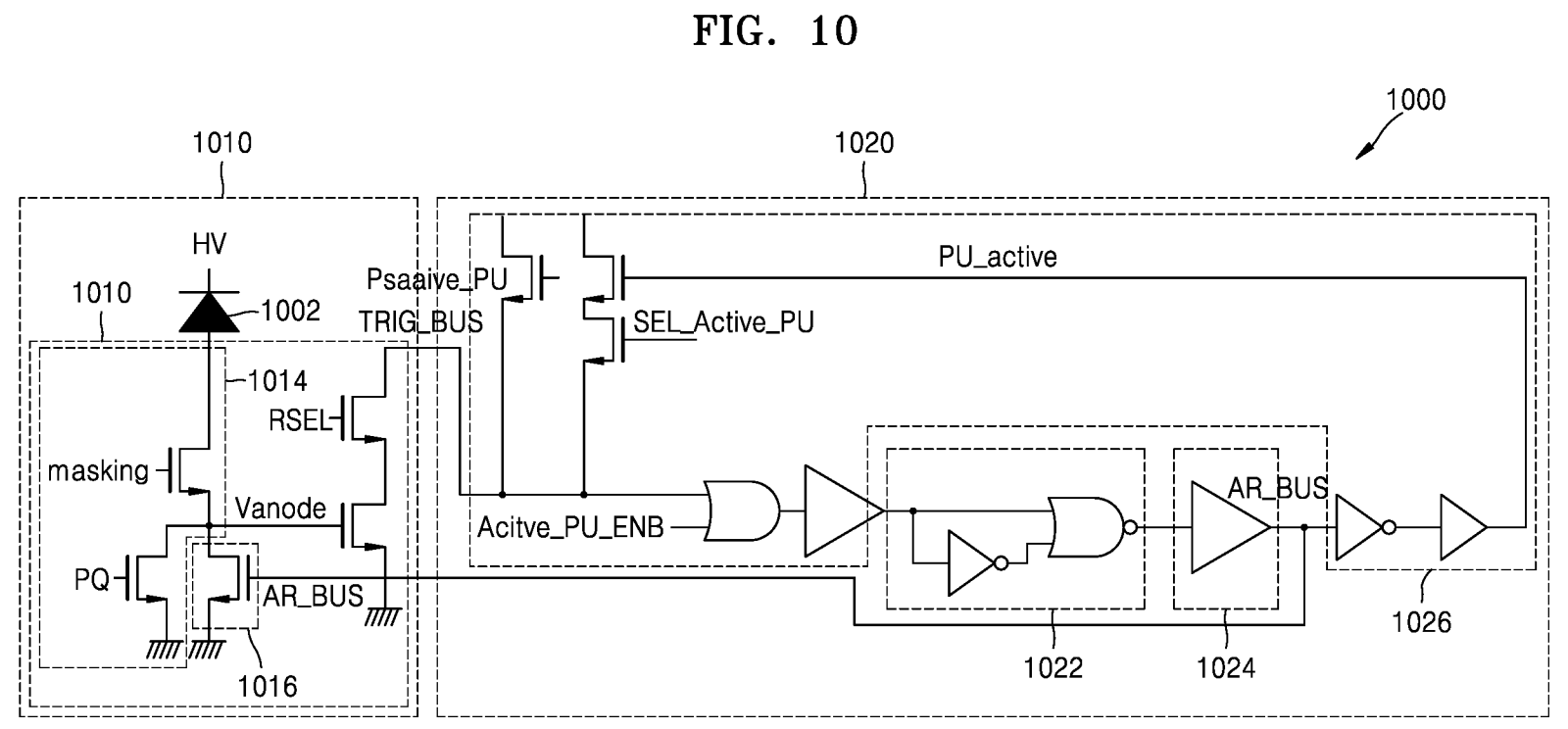

1000
1020
1026
1024
1022
1010
1002
1014
1016
PU_active
SEL_Active_PU
AR_BUS
Acitve_PU_ENB
Psaaive_PU
TRIG_BUS
RSEL
Vanode
HV
masking
PQ

ANALOG FRONT END (AFE) DEVICE FOR LIGHT-RECEIVING SENSOR AND METHOD OF CONTROLLING THE SAME

CROSS-REFERENCE TO RELATED APPLICATION

This application is based on and claims priority under 35 U.S.C. § 119 to Korean Patent Application No. 10-2023-0018868, filed on Feb. 13, 2023, in the Korean Intellectual Property Office, the disclosure of which is incorporated by reference herein in its entirety.

FIELD

One or more embodiments relate to an analog front end (AFE) device that outputs a detection signal of a sensor, and more particularly, to an AFE device for a light-receiving sensor that detects light and a method of controlling the AFE device.

BACKGROUND

Light-receiving sensors that detect light are used in various fields, such as Light Detection and Ranging (LiDAR) sensors, image sensors, and the like. For example, a LIDAR sensor emits laser and then detects reflected light by the object through a light-receiving sensor to detect the distance and location of an object through Time of Flight (ToF). At this time, an analog front end (AFE) device is required to output a detection signal of the light-receiving sensor.

Light-receiving sensors that detect light may include various kinds of photo-detecting devices, such as single photon avalanche diodes (SPADs), charge focusing SPADs, and the like. In the light-receiving sensor, photo-detecting devices, such as SPADs and the like, can be arranged in an array to detect light on a row-by-row basis. One SPAD and one AFE device become a pixel that detects light. A fill factor indicating the ratio of a region (i.e., a sensing region of the SPAD) that detects light, to the entire region of each pixel is decreased due to the AFE device that is present in each SPAD.

SUMMARY

One or more embodiments include an analog front end (AFE) device that may increase a fill factor of a light-receiving sensor and a method of controlling the AFE device.

Additional aspects will be set forth in part in the description which follows and, in part, will be apparent from the description, or may be learned by practice of the presented embodiments of the disclosure.

According to one or more embodiments, an analog front end (AFE) device for a light-receiving sensor includes a first signal processor implemented with a n-channel metal oxide semiconductor (NMOS) and a p-channel metal oxide semiconductor (PMOS) on a substrate and configured to output a detection signal of a photo-detecting device, and a second signal processor disposed in a position where the second signal processor is spaced apart from the first signal processor, on the substrate and configured to control a dead time of the photo-detecting device.

According to one or more embodiments, a method of controlling an analog front end (AFE) device, wherein the AFE device includes a plurality of first signal processors arranged in units of pixels one-to-one mapping with photo-detecting devices and a plurality of second signal processors arranged on a column-by-column basis or on a row-by-row basis in an array of the photo-detecting devices, the method includes: outputting detection signals of a plurality of light-receiving units on a row-by-row basis by using a plurality of first signal processors, generating control signals for recharging the plurality of photo-detecting devices on a row-by-row basis when the detection signals are received from the plurality of first signal processors by using the second signal processors, and converting the plurality of photo-detecting devices into operable states on a row-by-row basis when the control signals are received, by using the plurality of first signal processors.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 10 is a view illustrating an example of a detailed configuration of an AFE device according to an embodiment;

DETAILED DESCRIPTION

Figure 1:
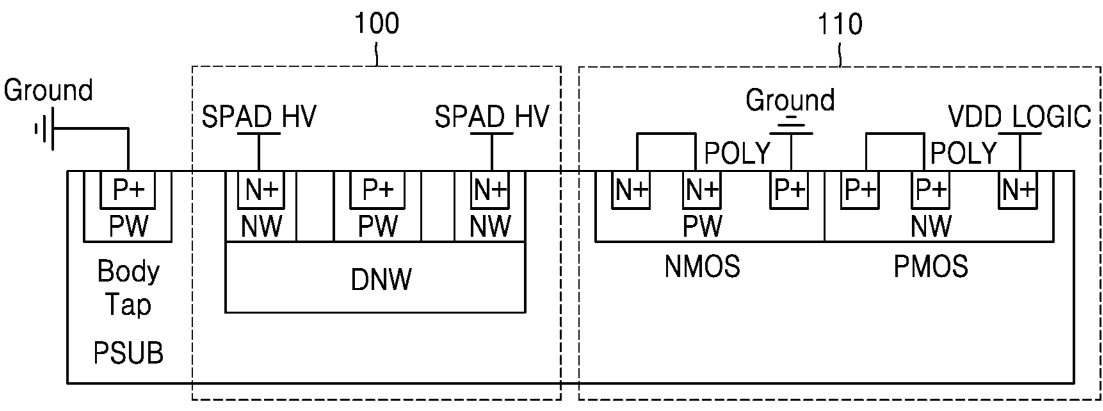
FIG. 1 is a view illustrating a cross-section of a light-receiving sensor implemented with single photon avalanche diode (SPAD) devices, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, an analog front end (AFE) device for a light-receiving sensor and a method of controlling the AFE device according to embodiments will be described in detail with reference to the accompanying drawings.

FIG. 1 is a view illustrating a cross-section of a light-receiving sensor implemented with single photon avalanche diode (SPAD) devices, according to an embodiment.

Referring to FIG. 1, the light-receiving sensor includes an SPAD 100 and an analog front end (AFE) device 110. The SPAD 100 and the AFE device 110 may be implemented on a semiconductor substrate. For example, the SPAD 100 may be implemented in a Deep N-Well (DNW).

The AFE device 110 includes a logic circuit for processing a detection signal indicating whether light is input to the SPAD 100 and controlling the dead time of the SPAD 100, and may be implemented with an n-channel metal oxide semiconductor (NMOS) and/or a p-channel metal oxide semiconductor (PMOS). In general, the AFE device 110 may be implemented by using both an NMOS and a PMOS for optimization of the size or performance when the AFE device 110 is implemented on the semiconductor substrate.

A voltage SPAD-HV (e.g., about 17 to about 20 V) applied to the SPAD 100 may be higher than a voltage VDD LOGIC (e.g., about 1.5 to about 3.3 V) applied to the AFE device 110. When the SPAD 100 and the PMOS of the AFE device 110 are adjacent to each other, punch-through occurs between the DNW of the SPAD 100 and a N-Well (NW) of the PMOS, so that the light-receiving sensor may not perform a normal operation. Thus, the PMOS of the AFE device 110 needs to be spaced apart from the SPAD by a certain distance. Since the NMOS of the AFE device 110 is implemented in a P-Well (PW), punch-through does not occur between the SPAD and the NMOS, so that the SPAD 100 and the NMOS may be disposed close to each other. However, when the DNW of the SPAD 100 and the PW of the NMOS are disposed too close to each other, "breakdown" may occur therebetween, and thus, a certain distance therebetween is required. Since a distance between the DNW of the SPAD 100 and the PW of the NMOS for a normal operation is less than a distance between the DNW of the SPAD 100 and the NW of the PMOS, the PW (NMOS) may be disposed on a side adjacent to the SPAD 100 and the NW (PMOS) may be disposed on a side distant from the SPAD 100. There is a limitation to increasing a fill factor of the light-receiving sensor due to a distance between the PMOS of the AFE device 110 and the SPAD 100.

Figure 2:
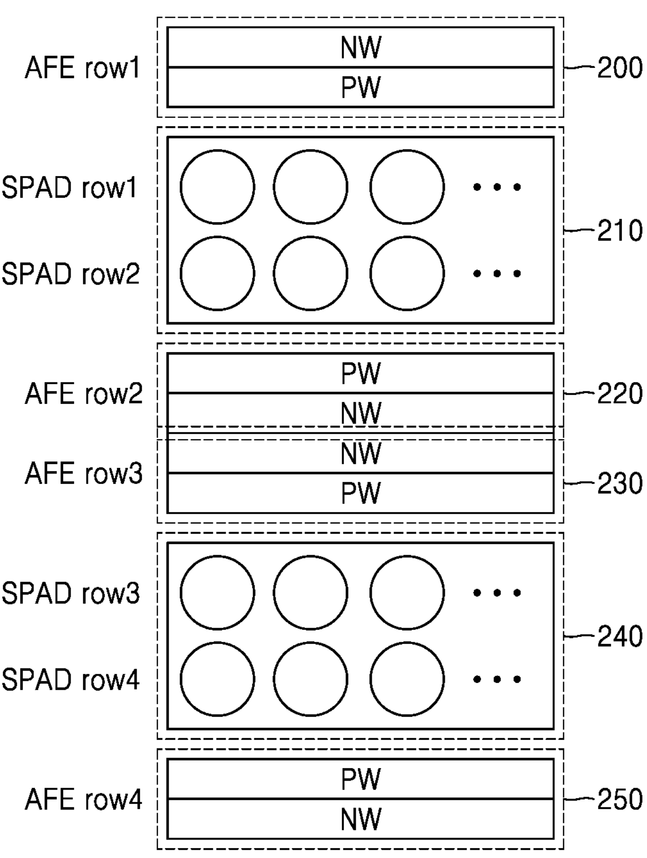
FIG. 2 is a plan view illustrating a light-receiving sensor implemented with an array of the SPAD devices of FIG. 1, according to an embodiment.

FIG. 2 is a plan view illustrating a light-receiving sensor implemented with an array of the SPAD devices 100 of FIG. 1, according to an embodiment.

Referring to FIGS. 1 and 2, the light-receiving sensor includes an array of a pair of the SPAD 100 and the AFE device 110. AFE device groups 200 and 220 for an SPAD group 210 in first and second rows may be arranged at the top and bottom of the SPAD group 210, and AFE device groups 230 and 250 for an SPAD group 240 in third and fourth rows may be arranged at the top and bottom of the SPAD group 240.

In order to increase the density (i.e., a fill factor) of the SPAD 100, the SPAD 100 may be implemented by sharing the DNW. The DNW may be shared by arranging the SPAD 100 in two rows horizontally. For example, the SPAD group 210 in the first and second rows and the SPAD group 240 in the third and fourth rows may be implemented in a common DNW.

The AFE device 110 for each SPAD 100 of the SPAD groups 210 and 240 each including two rows may be arranged at the top and bottom of the SPAD groups 210 and 240. Since the AFE device 110 includes an NMOS implemented in a PW and a PMOS implemented in an NW, the NMOS and PMOS of each of the AFE device groups 200, 220, 230, and 250 may be implemented in a common PW and in a common NW on a row-by-row basis. Since the PW does not need to be relatively far from the SPAD 100 compared to the NW, the PW may be disposed relatively close to the SPAD 100 compared to the NW and the NW may be disposed relatively far from the SPAD 100.

For example, when the SPAD group 210 in the first row includes 10 SPADs, 10 AFE devices 110 corresponding to 10 SPADs are present at the top of the first row in the SPAD group 210, all of NMOSs of 10 AFE devices 110 may be implemented in a common PW in the same row and all of PMOSs of 10 AFE devices 110 may also be implemented in a common NW in the same row. SPADs 100 in two rows may be implemented in a common DNW so that a distance between the SPADs 100 may be minimized, and the AFE device 110 in each row may be implemented in a common PW and a common NW so that a distance between AFE devices 110 may be minimized and thus a fill factor may be increased. However, since AFE device groups 220 and 230 in the second and third rows are present between the SPAD groups 210 and 240, there is a limitation to increasing the fill factor.

Figure 3:
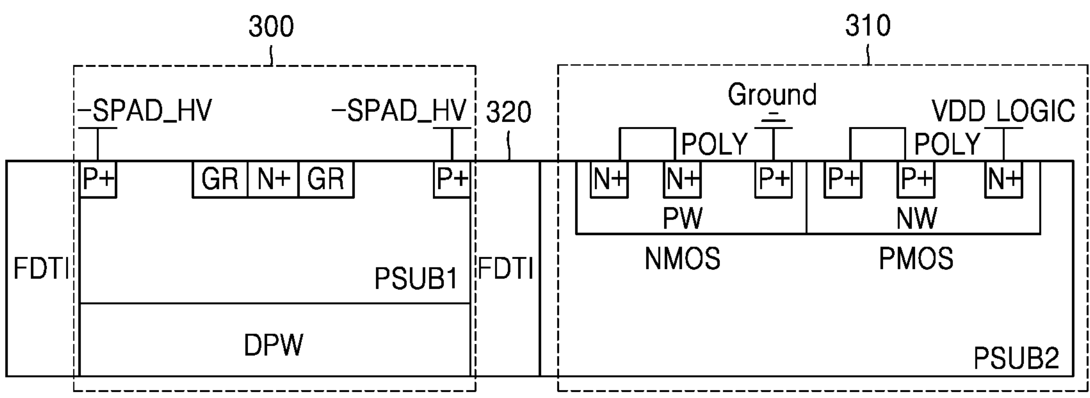
FIG. 3 is a view illustrating a cross-section of a light-receiving sensor implemented with charge focusing SPAD devices, according to an embodiment.

FIG. 3 is a view illustrating a cross-section of a light-receiving sensor implemented with charge focusing SPAD devices, according to an embodiment.

Referring to FIG. 3, the light-receiving sensor includes a charge focusing SPAD 300 and an AFE device 310. The charge focusing SPAD 300 requires applying of a negative (−) voltage to a substrate region PSUB1, whereas the AFE device 310 including an NMOS of which body is required to be 0 V for logic implementation requires not to apply a voltage to a substrate region PSUB2. Thus, when the charge focusing SPAD 300 and the AFE device 310 are implemented on a substrate, the substrate region PSUB1 in which the charge focusing SPAD 300 is implemented and the substrate region PSUB2 in which the AFE device 310 is implemented need to be isolated from each other by a full deep trench isolation (FDTI) structure 320 or the like. Thus, when the charge focusing SPAD 300 is used as a photo-detecting device, the fill factor is further decreased compared to the structure of FIG. 1 due to the FDTI structure 320.

Figure 4:
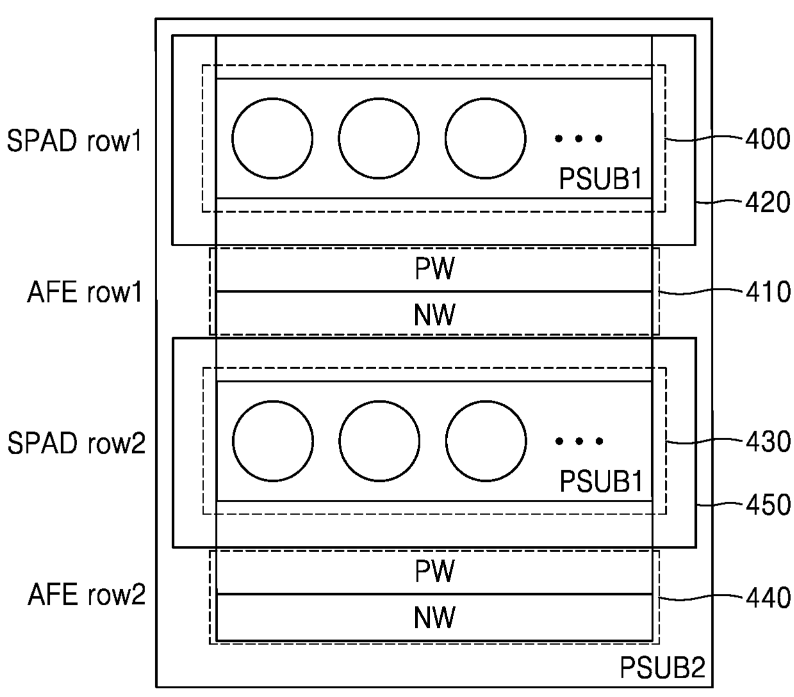
FIG. 4 is a plan view illustrating a light-receiving sensor implemented with an array of the charge focusing SPAD devices of FIG. 3, according to an embodiment.

FIG. 4 is a plan view illustrating a light-receiving sensor implemented with an array of the charge focusing SPADs 300 of FIG. 3, according to an embodiment.

Referring to FIGS. 3 and 4, a plurality of charge focusing SPADs 400 in a first row may be implemented in a common deep P-well (DPW). A plurality of AFE devices 410 in the first row may be implemented in a common PW and a common NW, as shown in FIG. 2. However, FDTI structures 420 and 450 for isolation from AFE devices 410 and 440 are present around a plurality of charge focusing SPADs 400 and 430 in first and second rows. There is a limitation to increasing the fill factor due to the FDTI structures 420 and 450. A method of increasing the fill factor of the light-receiving sensor will be described in the following diagrams including FIG. 6.

FIGS. 1 through 4 illustrate an SPAD and a charge focusing SPAD as an example of the photo-detecting device. However, this is just an example, and the photo-detecting device may be implemented with various devices according to the related art. However, hereinafter, for convenience of explanation, an SPAD will be mainly described as an example of the photo-detecting device. In addition, hereinafter, the SPAD may be interpreted as the charge focusing SPAD of FIG. 3 or the SPAD of FIG. 1.

Figure 5:
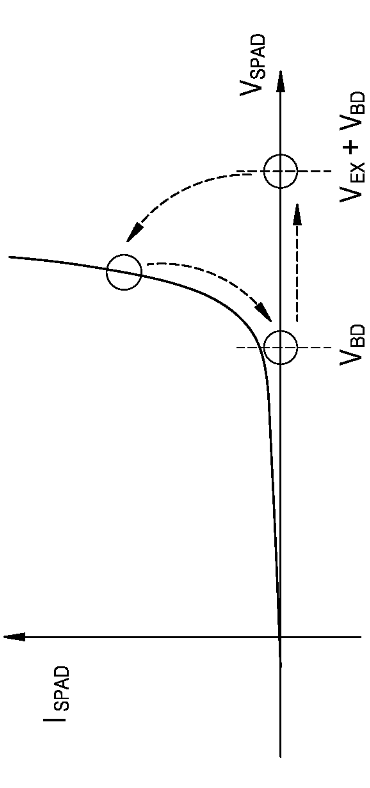
FIG. 5 is a view illustrating an example of an operating state of a photo-detecting device.
Figure 5:
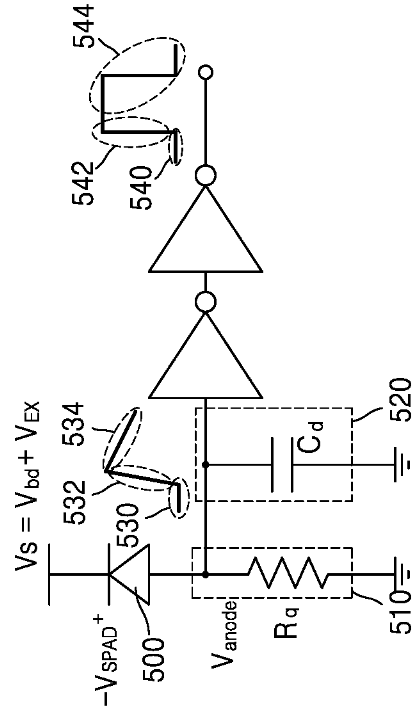

FIG. 5 is a view illustrating an example of an operating state of the photo-detecting device.

Referring to FIG. 5, an AFE device and an SPAD 500 that is the photo-detecting device are implemented with a resistor, a capacitor, and the like. The AFE device is implemented on a pixel unit by one-to-one mapping with the SPAD 500 and outputs the detection signal of the SPAD 500. The AFE device outputs a pulse when light is detected by the SPAD 500. Depending on the field where the light-receiving sensor is used, the form of a signal output by the AFE device may be varied in addition to a pulse form. However, in the following embodiments including the present embodiment, an AFE device that outputs a signal indicating whether the photo-detecting device detects light, in a pulse form will be assumed and described.

An operation of the SPAD 500 may be classified into three steps.

1) Avalanche 530 and 540: when light is irradiated on the SPAD 500 in a state in which a voltage $V_{SPAD}$ of the SPAD 500 exceeds a bias voltage $V_{BD}$, an "electron-hole pair" may be generated by the photoelectric effect and avalanche may occur. In an avalanche state, a rapid increase in a current $I_{SPAD}$ of the SPAD 500 starts. Thus, a voltage $V_{anode}$ of a resistor $R_q$ 510 is also rapidly increased.

2) Quench 532 and 542: when the voltage $V_{anode}$ of the resistor $R_q$ 510 reaches a maximum value $V_{EX}$, the possibility of avalanche is considerably decreased and the SPAD 500 is turned off. The AFE device converts $V_{anode}$ that is the detection signal of the SPAD 500 into a pulse signal (e.g., a digital pulse) and outputs the pulse signal.

3) Recharge 534 and 544: when the SPAD 500 is turned off through the quench step, charges of a capacitor $C_d$ 520 are discharged through the resistor $R_q$ 510, and thus, the voltage $V_{anode}$ of the resistor $R_q$ 510 is decreased. Here, the capacitor $C_d$ 520 indicates a parasitic capacitance of a diode. When the voltage $V_{anode}$ of the resistor $R_q$ 510 is decreased, the SPAD 500 is in a recharged state in which the SPAD 500 may operate again. The time (i.e., time constant=$C_d$*$R_q$) until the capacitor $C_d$ 520 is discharged, is a dead time of the SPAD 500. Hereinafter, a state in which the SPAD 500 may operate again, is referred to as a recharged state.

In the present embodiment, an example of an AFE device including the resistor $R_q$ 510, an inverter, and the like so as to output the detection signal $V_{anode}$ when light is incident on the SPAD 500 and to convert the SPAD 500 into an operable state, is shown. In general, a recharge time (i.e., dead time) for converting the SPAD 500 into a recharged state is determined by the capacitor $C_d$ 520 and the resistor $R_q$ 510. In addition, a problem 'paralyzable dead time' that, when light is newly incident on the SPAD 500 in the dead time, the dead time starts from that time so that the length of an output pulse signal of the AFE device is increased and an exact time when light is incident cannot be known, occurs. In other words, when the edge of an output pulse signal is identified as light incidence time, the length of the pulse signal is increased due to the light incident in the dead time and thus incidence time cannot be known. A method of solving the problem 'paralyzable dead time' will be described again in the following diagrams including FIGS. 10 through 15.

Figure 6:
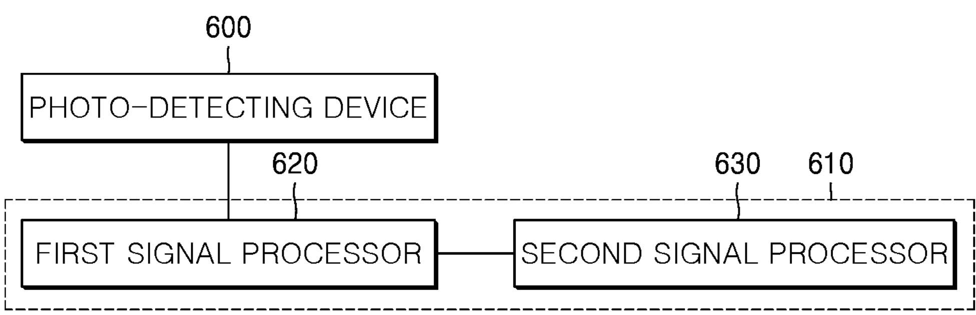
FIG. 6 is a view illustrating an example of an analog front end (AFE) device according to an embodiment.

FIG. 6 is a view illustrating an example of an AFE device according to an embodiment.

Referring to FIG. 6, an AFE device 610 includes a first signal processor 620 for outputting a detection signal of a photo-detecting device 600 and a second signal processor 630 for controlling a dead time of the photo-detecting device 600.

Figure 7:
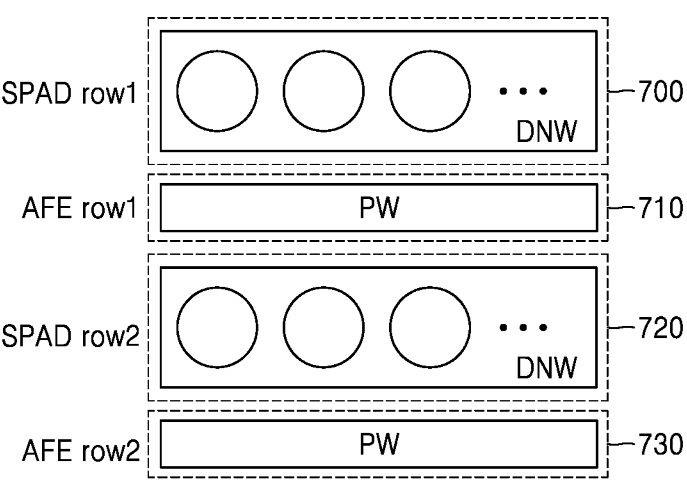
FIG. 7 is a plan view illustrating an example of a light-receiving sensor including an AFE device, according to an embodiment.

The first signal processor 620 is implemented with one of an NMOS and a PMOS on a substrate. In an embodiment, when the photo-detecting device 600 is the SPAD 100 implemented in an NW, as shown in FIG. 1, the first signal processor 620 may be implemented with an NMOS. When the first signal processor 620 is implemented only with the NMOS without the PMOS, problems such as punch-through and the like do not occur, and the first signal processor 620 may be disposed directly adjacent to the SPAD. The SPAD 100 of FIG. 1 is a structure in which a positive (+) voltage is applied to N and P is sensed. When the structure of the SPAD 100 becomes the opposite and the (−) voltage is applied to P and N is sensed, the first signal processor 620 may be implemented only with the PMOS. An example in which an array of a pair of the SPAD 100 and the first signal processor 620 of FIG. 1 is disposed, is illustrated in FIG. 7.

Figure 8:
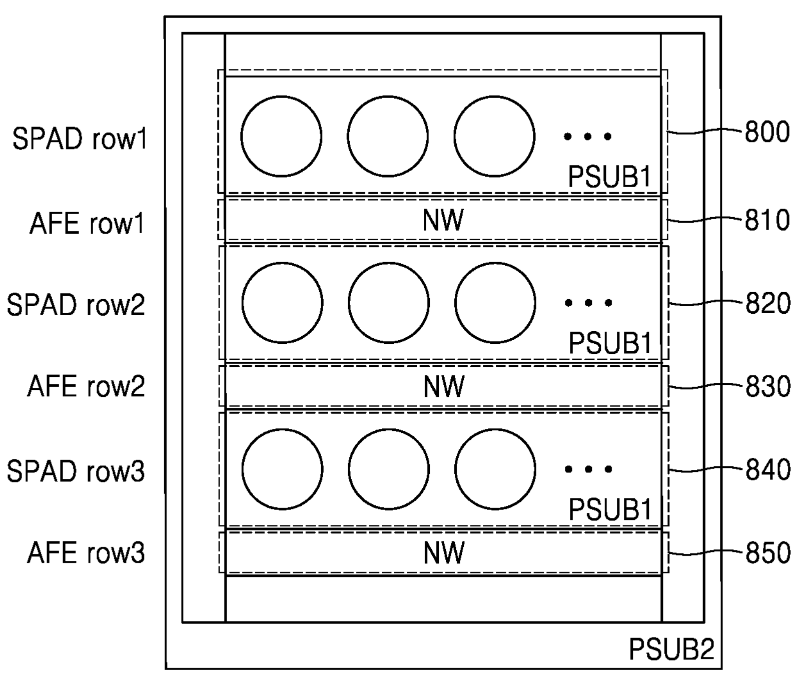
FIG. 8 is a plan view illustrating another example of a light-receiving sensor including an AFE device, according to an embodiment.

In another embodiment, when the photo-detecting device 600 is the charge focusing SPAD 300 implemented in a PW, as shown in FIG. 3, the first signal processor 620 may be implemented with a PMOS. In the PMOS in which logic is implemented, the PMOS may be normally driven even when a voltage that is not 0 V is applied to the substrate. Thus, when the first signal processor 620 is implemented only with a PMOS without an NMOS, the charge focusing SPAD 300 that requires applying of a (−) voltage to the substrate and the first signal processor 620 may be disposed adjacent to each other on the substrate without the FDTI structure 320. An example in which an array of a pair of the charge focusing SPAD 300 of FIG. 3 and the first signal processor 620 of FIG. 1 is disposed, is illustrated in FIG. 8.

The second signal processor 630 may be disposed in a position where the second signal processor 630 is spaced apart from the first signal processor 620, on the substrate to control the dead time of the photo-detecting device 600. The second signal processor 630 may be implemented with an NMOS and/or a PMOS. In an embodiment, when the first signal processor 620 is implemented with an NMOS, the second signal processor 630 may be implemented with a PMOS. In another embodiment, when the first signal processor 620 is implemented with a PMOS, the second signal processor 630 may be implemented with a NMOS.

When the light-receiving sensor includes an array of a plurality of photo-detecting devices, the first signal processor 620 may be arranged on a pixel-by-pixel basis one-to-one mapping with the photo-detecting device 600, and the second signal processor 630 may be arranged on a column-by-column basis or on a row-by-row basis in the array of photo-detecting devices. For example, the first signal processor 620 may include a logic implemented only with an NMOS or a PMOS so as to be disposed adjacent to the SPAD on a pixel-by-pixel basis, and the remaining logic may be implemented in the second signal processor 630. An AFE device for a light-receiving sensor having an array structure will be described again with reference to FIG. 9.

FIG. 7 is a plan view illustrating an example of a light-receiving sensor including an AFE device, according to an embodiment.

Referring to FIG. 7, the light-receiving sensor may include the SPAD 100 of FIG. 1 as a photo-detecting device. A first signal processor 620 of the AFE device is disposed adjacent to the SPAD on a pixel-by-pixel basis. A plurality of SPADs 700 and 720 in each row may be implemented in a common DNW and may be disposed adjacent to each other. In addition, a plurality of first signal processors 710 and 730 mapping with the plurality of SPADs 700 and 720 in each row may be implemented in a common PW and may be arranged adjacent to each other. A second signal processor 630 (not shown in FIG. 7) may be disposed outside the array of photo-detecting devices (i.e., an array of SPADs) and may be connected to the plurality of first signal processors 710 and 730.

In the present embodiment, a plurality of SPADs 700 and 720 in each row and a plurality of first signal processors 710 and 730 in each row may be alternately arranged, and the second signal processor (not shown) may be disposed outside the array of SPADs, and thus, a distance between the SPADs 700 and 720 in two rows may be smaller compared to FIG. 2. Thus, the fill factor of the light-receiving sensor according to the present embodiment may be increased compared to the light-receiving sensor of FIG. 2.

FIG. 8 is a plan view illustrating another example of a light-receiving sensor including an AFE device, according to an embodiment.

Referring to FIG. 8, the light-receiving sensor may include the charge focusing SPAD 300 of FIG. 3 as a photo-detecting device. The first signal processor 620 of the AFE device is disposed adjacent to the charge focusing SPAD 300 on a pixel-by-pixel basis. A plurality of charge focusing SPADs 800, 820, and 840 in each row may be implemented in a common PW and may be disposed adjacent to each other. In addition, first signal processors 810, 830, and 850, each of which is implemented in a PMOS, do not require an FDTI structure because even when a voltage applied to the substrate is not zero does not matter. That is, the first signal processors 810, 830, and 850 in each row and the charge focusing SPADs 800, 820, and 840 in each row may be arranged adjacent to each other without the FDTI structure. The second signal processor (not shown) may be arranged outside the array of photo-detecting devices (i.e., an array of charge focusing SPADs) and may be connected to the first signal processors 810, 830, and 850. A distance between the array of charging focusing SPADs is closer than in FIG. 4, so that the fill factor may be increased.

Figure 9:
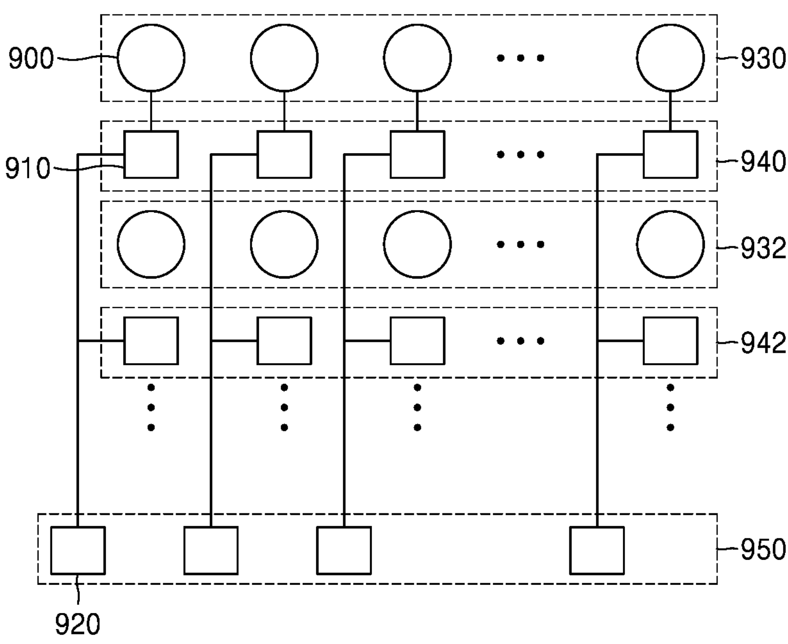
FIG. 9 is a view illustrating an example of an array structure of an AFE device according to an embodiment.

FIG. 9 is a view illustrating an example of an array structure of an AFE device according to an embodiment.

Referring to FIG. 9, the AFE device may include a plurality of first signal processor groups 940 and 942 and a second signal processor group 950. Each first signal processor 910 and each photo-detecting device 900 may be arranged by one-to-one mapping. That is, the first signal processor 910 and the photo-detecting device 900 may be arranged adjacent to each other on the substrate.

A second signal processor 920 may be arranged on a row-by-row basis or on a column-by-column basis in an array of a plurality photo-detecting devices. For example, when the first signal processor 910 is disposed on a row-by-row basis (or on a column-by-column basis), the second signal processor 920 may be disposed one by one in each column (or in each row) and thus may be connected to a plurality of first signal processors belonging to a corresponding column (or row). The second signal processor 920 may be present in each of first signal processor groups 940 and 942 on a row-by-row basis or on a column-by-column basis, and the form of the arrangement may be variously modified according to an embodiment and is not limited to the present embodiment. Hereinafter, an assumption that the first signal processor 910 is disposed on a row-by-row basis and the second signal processor 920 is present on a column-by-column basis, will be described.

Selection signals for selecting the first signal processor groups 940 and 942 in each row may be sequentially supplied in order to output detection signals of the photo-detecting device groups 930 and 932 on a row-by-row basis. For example, when a selection signal for selecting a first row is supplied to the signal processor group 940 in the first row, a plurality of first signal processors in the first row may output a detection signal of the corresponding photo-detecting device group 930 to the second signal processor group 950. Next, when a selection signal for selecting a second row is supplied to the signal processor group 942 in the second row, the second signal processor group 942 in the second row may output a detection signal of the corresponding photo-detecting device group 932 to the second signal processor group 950. That is, the second signal processor group 950 may receive detection signals on a row-by-row basis and then may process and output the detection signals. A control circuit for generating and outputting a selection signal in each row may be implemented with a part of an AFE device or a separate control circuit from the AFE device.

FIG. 10 is a view illustrating an example of a detailed configuration of an AFE device according to an embodiment.

Referring to FIG. 10, the AFE device may include a first signal processor 1010 and a second signal processor 1020. The first signal processor 1010 is present on a pixel-by-pixel basis, and the second signal processor 1020 is present on a row-by-row basis or on a column-by-column basis in the array of photo-detecting devices 1002. In the present embodiment, an assumption that the photo-detecting device 1002 is the SPAD 100 of FIG. 1, will be described.

The first signal processor 1010 is implemented with an NMOS to be disposed adjacent to the photo-detecting device 1002. When the direction of the photo-detecting device 1002 is opposite and the applied voltage of the photo-detecting device 1002 is opposite, the first signal processor 1010 may be implemented with a PMOS. However, hereinafter, for convenience of explanation, the case where the first signal processor 1010 is implemented with an NMOS, will be described.

Figure 12:
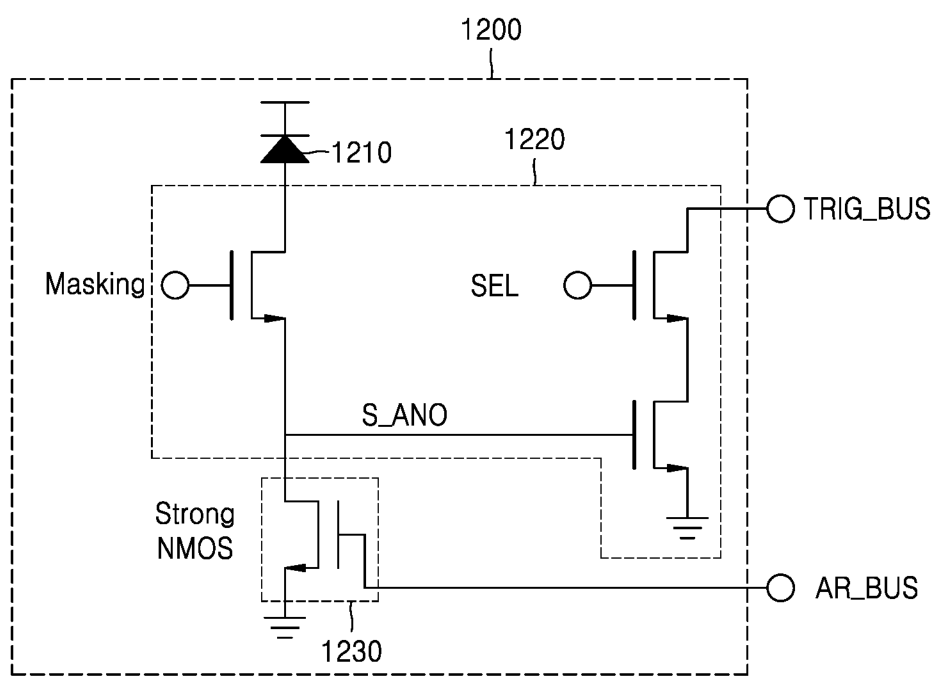
FIG. 12 is a view illustrating a first signal processor of the AFE device, according to another embodiment.
Figure 15:
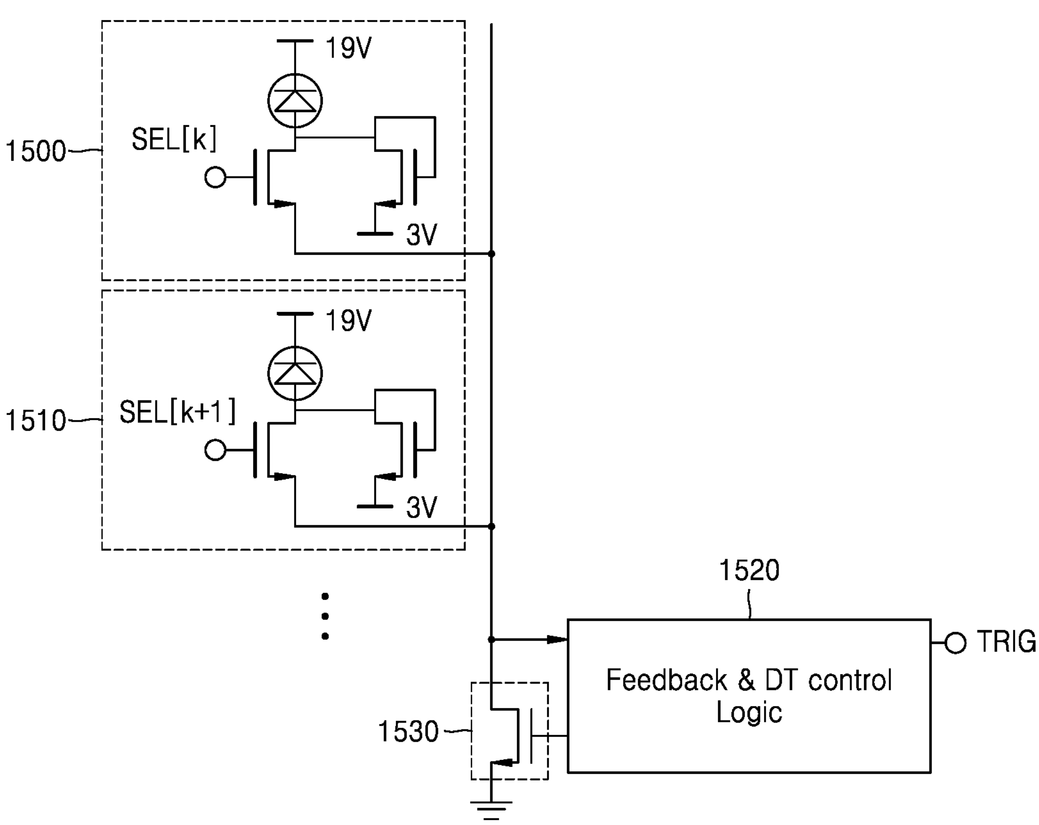
FIG. 15 is a view illustrating an AFE device according to another embodiment.

The first signal processor 1010 may include a signal detector 1014 for detecting and outputting a voltage of an output terminal of the photo-detecting device 1002 and a recharge unit 1016 for converting the photo-detecting device 1002 into an operable state after a certain dead time. In an embodiment, the signal detector 1014 may be implemented with a field-effect transistor (FET). When light is irradiated on the photo-detecting device 1002, a current flows through the photo-detecting device 1002 and a voltage $V_{anode}$ of the signal detector 1014 is increased. When the recharge unit 1016 receives a control signal AR_BUS from the second signal processor 1020, the voltage $V_{anode}$ of the output terminal of the photo-detecting device 1002 may be dropped, so that the photo-detecting device 1002 may be in an operable state again. The recharge unit 1016 may be implemented with an FET serially connected to the output terminal of the photo-detecting device 1002. For example, when the control signal AR_BUS is applied to the recharge unit 1016, a current may flow through the FET and a voltage of $V_{anode}$ may be dropped, so that the photo-detecting device is in a recharged state, as shown in FIG. 5. The signal detector 1014 for outputting a detection signal TRIG_BUS of the photo-detecting device 1002 may be modified in various forms and is not limited to the present embodiment. Various modification examples of the signal detector 1014 are shown in FIGS. 12 and 15.

The second signal processor 1020 receives the detection signal TRIG_BUS from the first signal processor 1010, and controls the dead time of the photo-detecting device 1002 The second signal processor 1020 may include a controller 1022 for generating the control signal AR_BUS and a delay unit 1024 for delaying the control signal for a certain time and then providing the delayed control signal to the first signal processor 1010. In addition, the second signal processor 1020 may further include a pull-up logic unit 1026 for initializing an input terminal to which the detection signal TRIG_BUS is input, when a certain time elapses after receiving the detection signal TRIG_BUS.

More specifically, the controller 1022 may generate the control signal AR_BUS having a gate voltage for driving the FET of the recharge unit 1016 of the first signal processor 1010. The controller 1022 may serve as a first delay unit for setting a recharge time. For example, when a control signal is generated by being delayed for a certain time through a NOT gate and a NOR gate of the controller 1022, for the delay time, the photo-detecting device 1002 may be maintained in an off state and a pulse signal having a width of the delay time may be output. In another embodiment, a first delay unit may also be implemented as a separate configuration from the controller 1022. The delay unit 1024 may serve as a second delay unit for setting a quenching time.

When the control signal AR_BUS is applied to the first signal processor 1010, the pull-up logic unit 1026 may perform an active pull-up operation of initializing the input terminal. When the input terminal to which the detection signal AR_BUS is input is initialized, the second signal processor 1020 is in a state in which a new detection signal may be received. The second signal processor 1020 according to the present embodiment is just an example, and a logic for controlling a dead time and the like may be modified in various forms and is not limited to the present embodiment.

Figure 11:
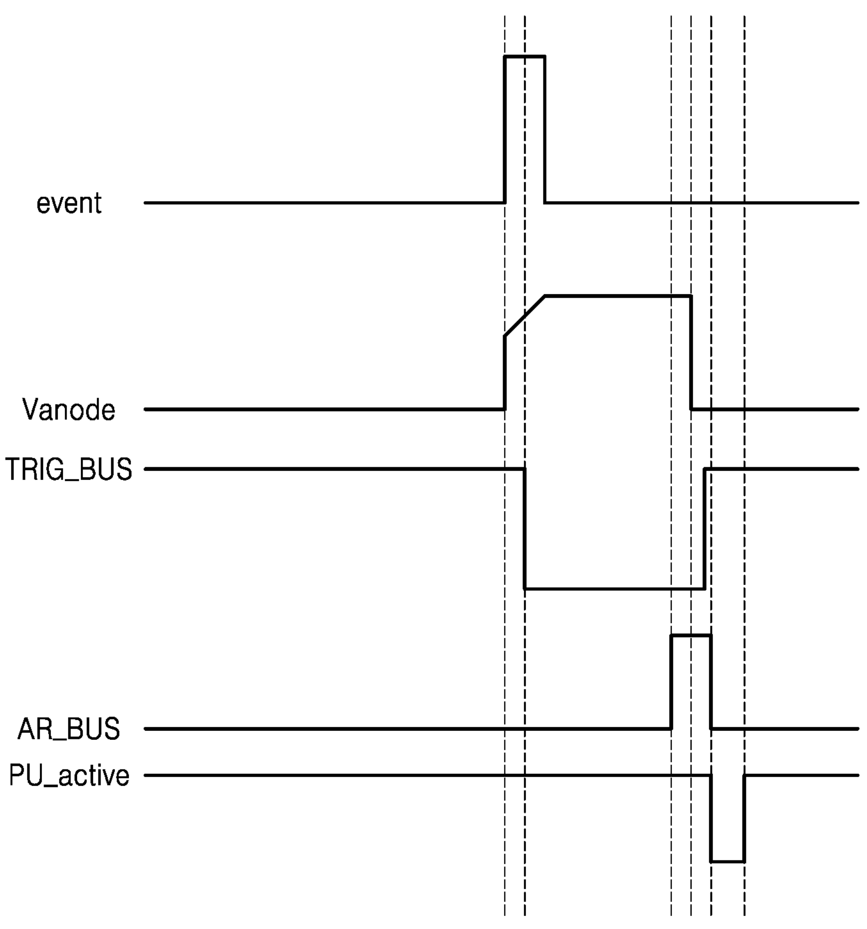
FIG. 11 is a view illustrating an operating procedure of the AFE device of FIG. 10.

FIG. 11 is a view illustrating an operating procedure of the AFE device of FIG. 10. In the present embodiment, for the AFE device of FIG. 10, an assumption that VDD=1.5V, Masking=3.3V, PQ<=400 mV, RSEL='H', Active_PU_ENB='L' and SEL_Active_PU='L' will be described. RSEL represents a selection signal for selecting a corresponding pixel 1000.

FIGS. 10 and 11 will be described together. When light is incident on the photo-detecting device 1002, the photo-detecting device 1002 is in a quenching state, as shown in FIG. 5, and the voltage $V_{anode}$ of the signal detector 1014 is increased (①). Since RSEL'H', the 'TRIG_BUS' signal is pre-charged by 'passive PU TR', when the voltage $V_{anode}$ of the signal detector 1016 rises, a pull-down edge occurs in the TRIG_BUS' signal of the input terminal of the second signal processor 1020 (②).

Since 'Active_PU_ENB'='L', the pull-down 'TRIG_BUS' signal is input to the controller 1022 for generating the control signal AR_BUS through an OR gate and a first buffer. The controller 1022 generates the control signal AR_BUS after a certain time delay through the NOT gate and the NOR gate (③). A recharge time may be adjusted through the controller 1022 including the NOT gate and the NOR gate, etc. That is, 'recharge time=pulse width'. The control signal AR_BUS may be delayed through the delay unit 1024 for a certain time. The time of the quenching time of the photo-detecting device may be determined through the delay unit 1024. In other words, the delay time of the delay unit 1024 may be a quenching time.

When the control signal AR_BUS reaches the recharge unit 1016 of the first signal processor 1010 through line delay, the FET of the recharge unit 1016 may be turned on and a voltage $V_{anode}$ drops (④). That is, the photo-detecting device is converted into a recharged state, as shown in FIG. 5, to be operable again.

The control signal AR_BUS may be transmitted to the pull-up logic 1026 via the NOT gate and the buffer. When the control signal AR_BUS is input to the pull-up logic 1026 connected to the input terminal to which the 'TRIG BUS' signal is input, the pull-up logic 1026 may be initialized in a state in which a new detection signal may be input, by performing active pull-up.

In the present embodiment, the photo-detecting device 1002 may have a dead time (① to ④) from the time when light is incident on the photo-detecting device 1002, to the recharged state. In addition, 'TRIG_BUS' has a dead time (② to ⑥) until active pull-up proceeds, and the dead time of the AFE device is a section from the moment when light is incident on the SPAD 1002 until a pull-up logic proceeds (① to ⑥).

In the present embodiment, an asynchronous method that does not require a clock signal is suggested. Thus, there is no need for a separate clock circuit to generate a clock signal In addition, in the present embodiment, a 'non-paralyzable' dead time in which the photo-detecting device 1002 does not operate (fires) even when light is incident on the photo-detecting device 1002 in the middle of the dead time, is provided.

FIG. 12 is a view illustrating a first signal processor of an AFE device, according to another embodiment.

Referring to FIG. 12, the first signal processor may one-to-one map with a photo-detecting device 1210 and may be present in the unit of a pixel 1200. The first signal processor includes a signal detector 1220 for outputting a detection signal of the photo-detecting device 1210 and a recharge unit 1230 that enables the photo-detecting device 1210 to be operable again.

Figure 13:
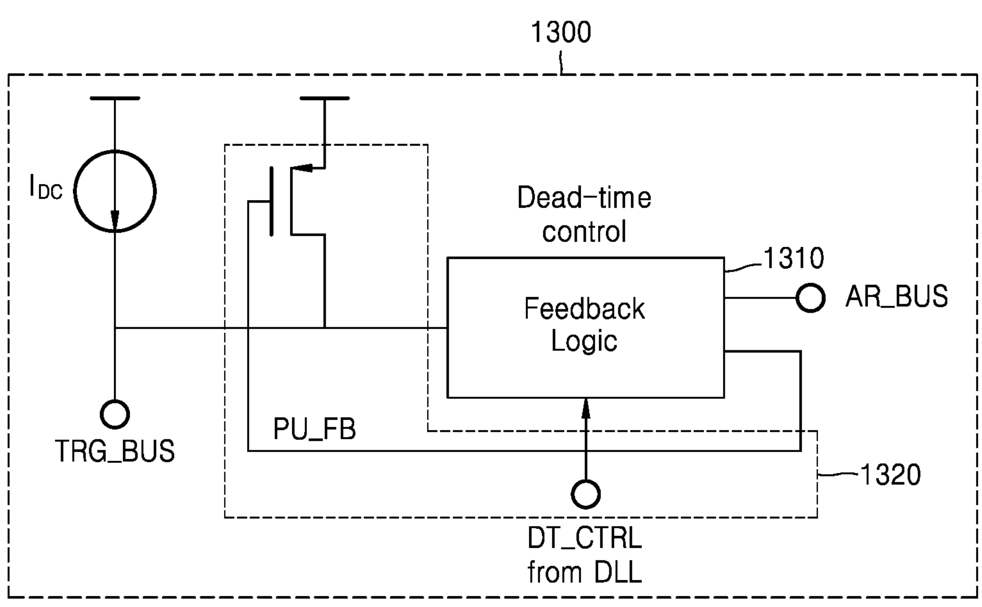
FIG. 13 is a view illustrating a second signal processor of the AFE device, according to another embodiment.

FIG. 13 is a view illustrating a second signal processor of an AFE device, according to another embodiment.

Referring to FIG. 13, when receiving the 'TRIG_BUS' signal from the first signal processor, a second signal processor 1300 may be configured to implement a controller 1310 for generating a control signal AR_BUS for converting the photo-detecting device into a recharged state, with a feedback logic. In addition, the second signal processor 1300 includes a pull-up logic unit 1320 for initializing the input terminal of the 'TRIG_BUS' after the control signal AR_BUS is output.

Figure 14:
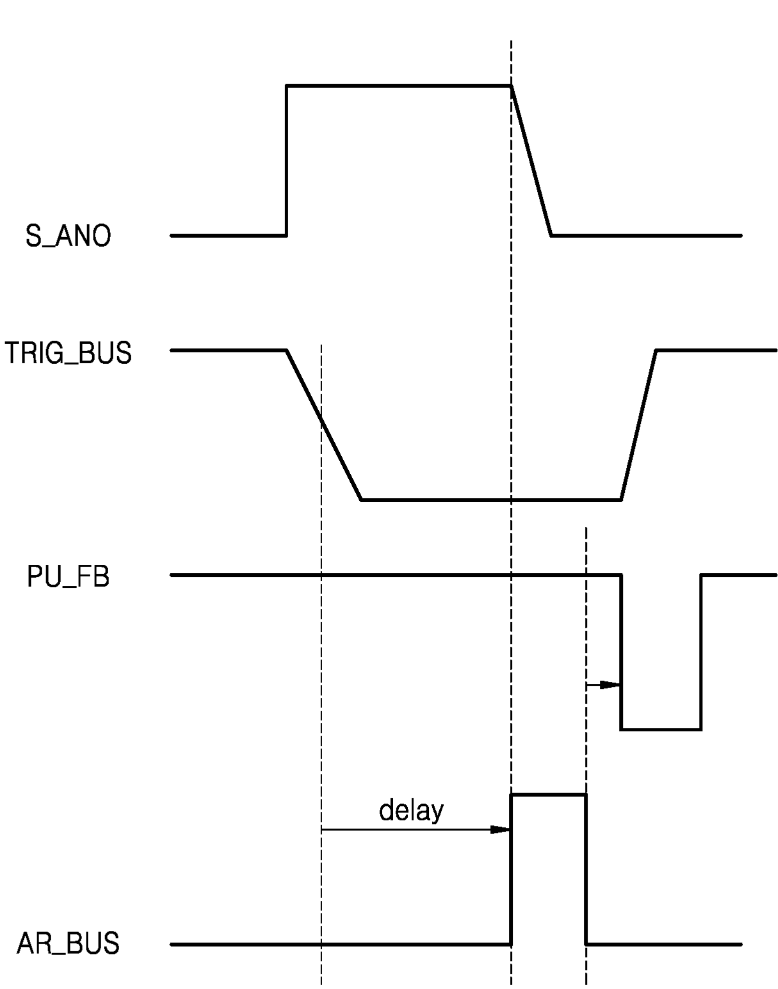
FIG. 14 is a view illustrating an operating procedure in the case where the AFE device is implemented with the structure of FIGS. 12 and 13, according to an embodiment.

FIG. 14 is a view illustrating an operating procedure in which the AFE device is implemented with the structure of FIGS. 12 and 13, according to an embodiment.

Referring to FIGS. 12 through 14, when light is incident on the photo-detecting device 1210, a voltage S_ANO of the signal detector 1220 may rise. A detection signal TRIG_BUS of a pull-down edge may be input to the second signal processor 1300. The controller 1310 of the second signal processor 1300 may generate and output the control signal AR_BUS. In this case, a certain time is required until the controller 1310 receives the detection signal TRIG_BUS and outputs the control signal AR_BUS. The FET of the recharge unit 1230 of the first signal processor 1200 may be turned on when the control signal AR_BUS is input to the FET of the recharge unit 1230 of the first signal processor 1200. Thus, the voltage S_ANO may drop so that the photo-detecting device 1210 may be in a recharged state.

When a certain time elapses after the control signal AR_BUS is output, the controller 1310 may output an initialization signal PU_FB to the pull-up logic unit 1320. The pull-up logic unit 1320 that receives the initialization signal PU_FB may initialize the input terminal to which the detection signal TRIG_BUS is input.

FIG. 15 is a view illustrating an AFE device according to another embodiment.

Referring to FIG. 15, a first signal processor of the AFE device is present in units of pixels 1500 and 1510. There is a common second signal processor 1520 for a plurality of first signal processors belonging to the same column. In addition, there is a common recharge unit 1530 for recharging a plurality of photo-detecting devices belonging to the same column. The recharge units 1016 and 1230 of FIGS. 10 and 12 are present in units of pixels. However, the recharge unit 1530 according to the present embodiment is present in each column with the second signal processor 1520.

For example, when a pixel 1500 in a k-th row is selected, the second signal processor 1520 may receive a detection signal from the first signal processor in the k-th row and may supply a control signal for recharging the photo-detecting device in the k-th row to the recharge unit 1530. When the recharge unit 1530 is turned on in response to the control signal, the photo-detecting device in the k-th row may be converted into a recharged state. Next, when the pixel 1510 in a (k+1)-th row is selected, the second signal processor 1520 may perform an operation of receiving a detection signal from a first signal processor in the (k+1)-th row and controlling a dead time.

Figure 16:
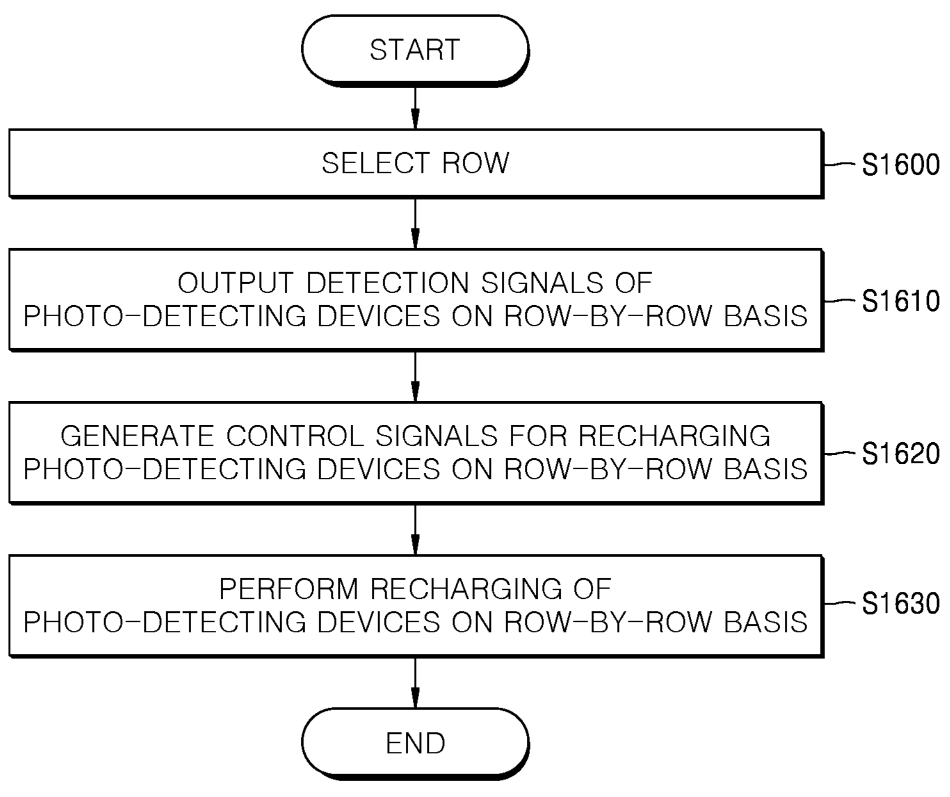
FIG. 16 is a flowchart illustrating a method of controlling an AFE device, according to an embodiment.

FIG. 16 is a flowchart illustrating a method of controlling an AFE device according to an embodiment.

Referring to FIGS. 9 and 16, the AFE device includes a plurality of first signal processors that are present on a pixel-by-pixel basis and a plurality of second signal processors that are present on a column-by-column basis in an array of photo-detecting devices. A control circuit may output a selection signal for selecting a first row (S1600). A plurality of first signal processors in the first row may output detection signals of photo-detecting devices (S1610).

A plurality of second signal processors that receive detection signals of a plurality of first signal processors on a row-by-row basis may generate and output control signals for recharging the photo-detecting devices on a row-by-row basis (S1620). When the plurality of first signal processors in the first row receive the control signals from the plurality of second signal processors, the photo-detecting device may be converted into an operable recharge state on a row-by-row basis (S1630).

When processing in the first row is completed, the control circuit may repeatedly perform an operation of outputting the detection signals of the photo-detecting devices in a second row and controlling dead time. In this manner, the detection signals of the photo-detecting devices in a plurality of rows may be sequentially output.

Figure 17:
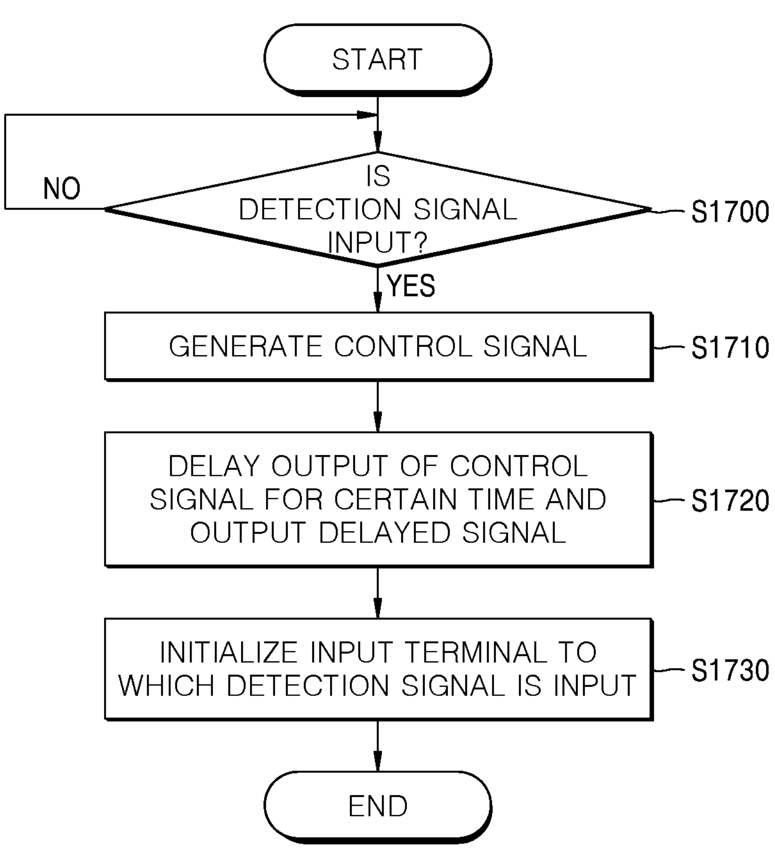
FIG. 17 is a flowchart illustrating a detailed operating procedure of a second signal processor of an AFE device, according to an embodiment.

FIG. 17 is a flowchart illustrating a detailed operating procedure of a second signal processor of an AFE device according to an embodiment.

Referring to FIG. 17, the second signal processor may receive a detection signal from a first signal processor (S1700). The second signal processor may generate a control signal for converting the photo-detecting device into a recharge state (S1710). The second signal processor may delay an output of the control signal for a certain time and then may output the delayed signal to the first signal processor for a pre-defined dead time (S1720). The second signal processor may initialize the input terminal to which the detection signal is input and may convert the input terminal of the detection signal into a state in which a new detection signal may be input (S1730).

According to an embodiment, the AFE device may be implemented with an NMOS or a PMOS and may be disposed adjacent to the photo-detecting device (e.g., an SPAD, a charge focusing SPAD, etc.) so that the fill factor may be increased. In another embodiment, asynchronous dead-time control, which does not require a clock signal, may be performed. In another embodiment, a problem 'paralyzable dead time', where the photo-detecting device operates (fires) again in the dead time and the dead time restarts from the time, may be solved through asynchronous dead-time control.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. An analog front end (AFE) device comprising:

a first signal processor implemented using only one type of a n-channel metal oxide semiconductor (NMOS) or a p-channel metal oxide semiconductor (PMOS) on a substrate and configured to output a detection signal of a photo-detecting device; and a second signal processor disposed in a position where the second signal processor is spaced apart from the first signal processor, on the substrate and configured to control a dead time of the photo-detecting device, wherein the first signal processor is disposed on a pixel-by-pixel basis one-to-one mapping with the photo-detecting device, each of the second signal processors is arranged outside an array of the photo-detecting devices, and is connected to a plurality of the first signal processors arranged in each column or each row of the array of the photo-detecting devices, wherein each of the first signal processors comprises:

a signal detector configured to detect and output a voltage of an output terminal of the photo-detecting device; and a recharge unit configured to drop the voltage of the output terminal of the photo-detecting device in response to a control signal received from the second signal processor after the detection signal is output and to convert the photo-detecting device into an operable state.

2. The AFE device of claim 1, wherein the photo-detecting device comprises a single-photon avalanche diode (SPAD) implemented in an N-well, and the first signal processor is implemented with an NMOS.

3. The AFE device of claim 1, wherein the photo-detecting device comprises a charge focusing SPAD that requires applying of a negative (−) voltage to the substrate, and the first signal processor is implemented with a PMOS.

4. The AFE device of claim 1, wherein the first signal processor is implemented with an NMOS and the second signal processor is implemented with a PMOS, or the first signal processor is implemented with a PMOS and the second signal processor is implemented with an NMOS.

5. The AFE device of claim 1, wherein the second signal processor is disposed on a column-by-column basis or on a row-by-row basis in the array of the photo-detecting devices.

6. The AFE device of claim 5, wherein a plurality of first signal processors are implemented in a common N-well or P-well on a row-by-row basis or on a column-by-column basis.

7. The AFE device of claim 5, wherein the second signal processor is implemented in a common N-well or P-well outside the array of the photo-detecting devices.

8. The AFE device of claim 1, wherein the recharge unit is implemented with a metal oxide semiconductor field effect transistor (MOSFET) serially connected to the output terminal of the photo-detecting device, and the control signal is applied to a gate terminal of the MOSFET.

9. The AFE device of claim 1, wherein the second signal processor comprises:

a controller configured to generate the control signal when the detection signal is received; and a delay unit configured to delay the control signal for a certain time and to provide the delayed signal to the first signal processor.

10. The AFE device of claim 9, wherein the second signal processor further comprises a pull-up logic unit configured to initialize an input terminal to which the detection signal is input, when a certain time elapses after the detection signal is received.

11. An analog front end (AFE) device comprising:

a first signal processor implemented using only one type of a n-channel metal oxide semiconductor (NMOS) or a p-channel metal oxide semiconductor (PMOS) on a substrate and configured to output a detection signal of a photo-detecting device;

a second signal processor disposed in a position where the second signal processor is spaced apart from the first signal processor, on the substrate and configured to control a dead time of the photo-detecting device;

a signal detector configured to detect and output a voltage of an output terminal of the photo-detecting device; and a recharge unit configured to drop the voltage of the output terminal of the photo-detecting device in response to a control signal received from the second signal processor after the detection signal is output and to convert the photo-detecting device into an operable state, wherein the signal detector is disposed on a pixel-by-pixel basis one-to-one mapping with the photo-detecting device, and the recharge unit is commonly disposed on a column-by-column basis or on a row-by-row basis in an array of photo-detecting devices.

* * * * *